United States Patent [19]
Lopez et al.

[11] Patent Number: 5,691,879
[45] Date of Patent: Nov. 25, 1997

[54] LOCKING APPARATUS INCLUDING KEY ACTUATED MOVABLE LOCKING BAR FOR DISK DRIVE CARRIERS

[75] Inventors: Arthur Lopez; Steven L. Sands, both of Austin, Tex.

[73] Assignee: Dell USA, L.P., Round Rock, Tex.

[21] Appl. No.: 748,850

[22] Filed: Nov. 14, 1996

[51] Int. Cl.⁶ .............................. G06F 1/16; H05K 5/02; E05B 65/46; G11B 33/02

[52] U.S. Cl. ......................... 361/685; 361/726; 312/219; 70/82; 70/86; 70/163

[58] Field of Search ..................... 364/708.1; 312/216, 312/217, 219; 70/82, 63, 86, 163, 164; 361/683, 685, 725–727, 740, 759, 801

[56] References Cited

U.S. PATENT DOCUMENTS

| | | | |
|---|---|---|---|
| 3,866,993 | 2/1975 | Dean et al. | 312/216 |
| 4,303,287 | 12/1981 | Taplin | 312/215 |
| 4,662,776 | 5/1987 | Hedstrom et al. | 403/387 |
| 4,685,312 | 8/1987 | Lakoski et al. | 70/14 |
| 5,019,932 | 5/1991 | Iwata | 360/105 |
| 5,212,681 | 5/1993 | Bock et al. | 369/244 |
| 5,216,662 | 6/1993 | Stefansky et al. | 369/215 |

Primary Examiner—Michael W. Phillips
Attorney, Agent, or Firm—Skjerven, Morrill, MacPherson, Franklin & Friel, LLP; M. Kathryn Braquet Tsirigotis

[57] ABSTRACT

The present invention provides a simple, compact and cost effective locking device that simultaneously secures a multiple of hard disk drive carriers or cartridges in a disk drive housing. The disk drive housing includes at least two disk drive carrier bays in a disk drive carrier opening for housing associated disk drive carriers. The locking device of the present invention secures the disk drive carriers into the disk drive carrier bays and therefore into the disk drive housing. The locking device includes a moveable locking bar assembly located inside the disk drive housing and spanning the disk drive carrier bays and comprises a locking bar and at least two locking pins projecting from the locking bar, one locking pin for each of the disk drive carriers, wherein the locking bar is moveable to either a locked or an unlocked position. A cam mechanism is positioned for engaging and camming the locking bar assembly so as to move the locking bar assembly to either the locked position or the unlocked position and a key lock assembly actuates the cam mechanism. The key lock assembly is attached to the disk drive housing and is accessible from the exterior of the disk drive housing. In the first embodiment of the present invention, the locking bar is a substantially flat, rectangular-shaped bar and the locking pins are planar with the locking bar, and in the second embodiment of the present invention, the locking bar is a substantially flat, rectangular-shaped bar and the locking pins project perpendicular of the locking bar.

22 Claims, 5 Drawing Sheets

LOCKING APPARATUS INCLUDING KEY ACTUATED MOVABLE LOCKING BAR FOR DISK DRIVE CARRIERS

BACKGROUND OF THE INVENTION

1. Field of the Invention

This invention relates to locking devices for data storage systems in computers and, in particular, an apparatus and method for locking a plurality of disk drive carriers or cartridges into a data storage system frame.

2. Description of the Related Art

It is a problem in hard disk drive housing and mounting arrangements in computer systems or subsystems, such as hard disk drive array units, to provide a mechanically simple and cost effective device that enables reliable locking of a plurality of disk drive carriers or cartridges for transportation packaging and security of data stored. Another important design consideration for locking devices is small size especially if the locking device is to be internal to the disk drive housing.

There are numerous types of apparatus and methods for locking disk drive cartridges or carriers within a cabinet or housing for packaging and security. One method is to simply install key locks on each individual hard disk drive carrier assembly. However, this burdens each carrier with the added cost of the key lock and requires the operator to keep track of multiple keys. Another approach is to use an access or cover door on either the entire cabinet or that section which houses the disk drives and then lock the access door. However, the access door is costly and awkward to use. Accordingly, there is a need for a simple, compact and cost effective locking device for securing multiple hard drives carriers within a housing structure.

SUMMARY OF THE INVENTION

The present invention provides a simple, compact and cost effective locking device which is operated with a single key lock that simultaneously secures a multiple of hard disk drive carriers or cartridges in a disk drive housing within a confined space in, for instance, a hard drive array storage cabinet or a central computer system.

The disk drive housing includes at least two disk drive carrier bays in a disk drive carrier opening for housing associated disk drive carriers. The locking device of the present invention secures the disk drive carriers into the disk drive carrier bays and therefore into the disk drive housing. The locking device includes a moveable locking bar assembly located inside the disk drive housing and spanning the disk drive carrier bays and comprises a locking bar and at least two locking pins projecting from the locking bar, one locking pin for each of the disk drive carriers, wherein the locking bar is moveable to either a locked or an unlocked position. A cam mechanism is positioned for engaging and camming the locking bar assembly so as to move the locking bar assembly to either the locked position or the unlocked position and a key lock assembly actuates the cam mechanism. The key lock assembly is attached to the disk drive housing and is accessible from the exterior of the disk drive housing.

In the first embodiment of the present invention, the locking bar is a substantially flat, rectangular-shaped bar and the locking pins are planar with the locking bar. In the second embodiment of the present invention, the locking bar is a substantially flat, rectangular-shaped bar and the locking pins project perpendicular of the locking bar. The locking pins are, for example, disposed in from of the disk drive carriers when the locking bar assembly is in the locked position, wherein the disk drive carriers are secured into the disk drive carrier bays, or, preferably, a slot is included in each disk drive carrier wherein, when the locking bar assembly is in the locked position, the locking pins engage the slots of the corresponding disk drive carriers securing the disk drive carriers into the disk drive carrier bays.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figures 1, 2:
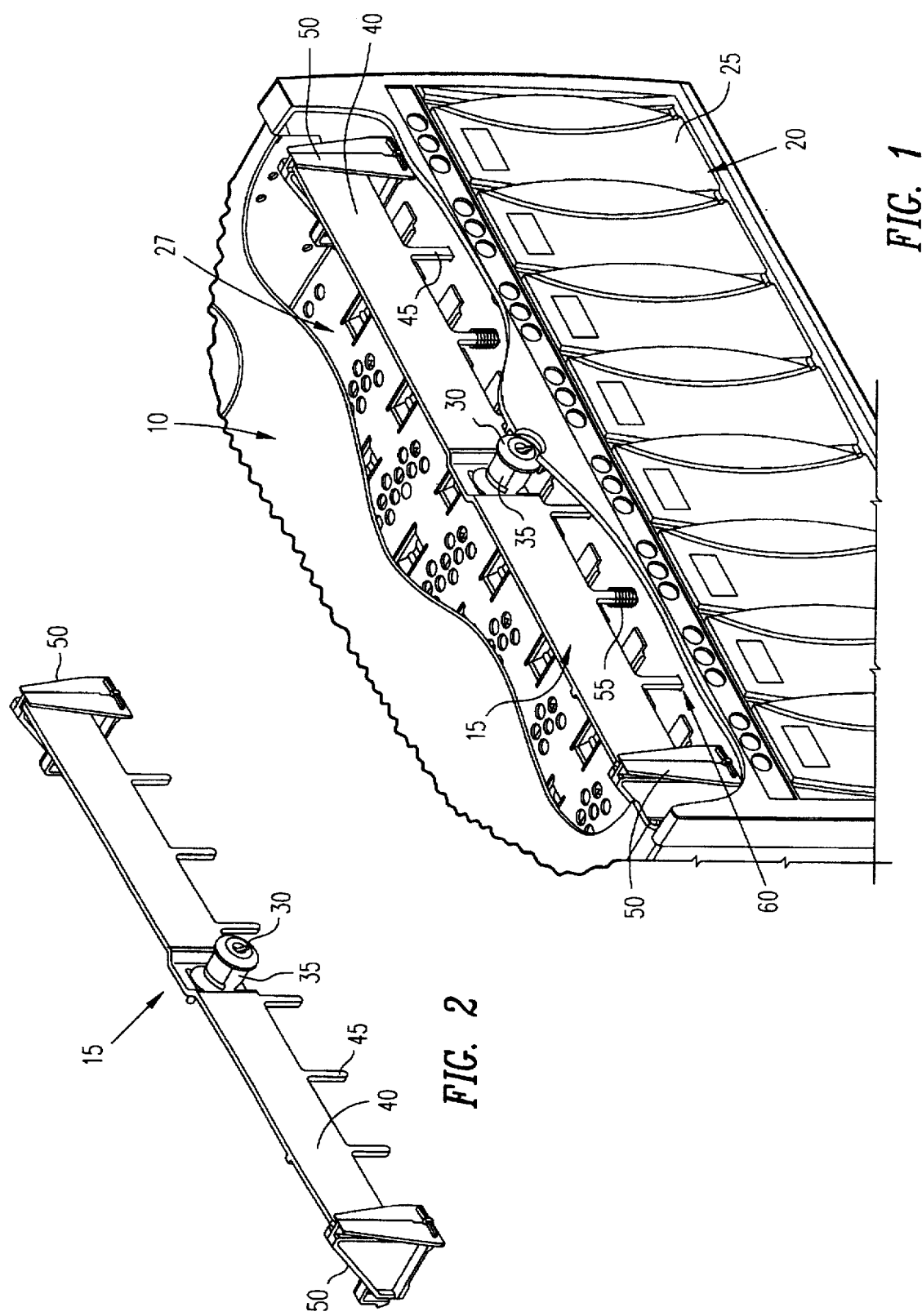
FIG. 1 is a partial perspective view, cut away for clarity, of a disk drive storage cabinet including a locking device in accordance with a first embodiment of the present invention.
FIG. 2 is a perspective view of the locking bar assembly and guides of the FIG. 1.

In the description which follows, the drawing figures are not necessarily to scale and like parts are marked throughout the specification and drawings with the same reference numerals, respectively.

Referring now to FIG. 1, illustrated is a partial perspective view, cut away for clarity, of a disk drive housing 10 or storage cabinet which incorporates a moveable locking bar assembly 15 in accordance with a first embodiment of the present invention. The disk drive housing 10 includes a frame 27 with at least two disk drive carrier bays 20 in a disk drive carrier opening for housing associated disk drive carriers 25. Disk drive housing 10 is, for instance, a hard drive array storage unit or other conventional structure for computer systems or subsystems having multiple hard disk drives. The locking device of the present invention secures the disk drive carriers 25 into the disk drive carrier bays 20 and includes a locking bar assembly 15 with a key lock assembly 30 and a cam mechanism 35 for positioning the locking bar assembly 15 in either a locked or an unlocked position.

The moveable locking bar assembly 15 is located inside the disk drive housing 10 and spans the disk drive carrier bays 20 and includes a locking bar 40 and at least two locking pins 45 projecting from the locking bar 40, one locking pin 45 for each of the disk drive carriers 25. The locking bar 40 is moveable to either the locked or the unlocked position (illustrated and further described in FIGS. 5A–5B). A cam mechanism 35 is positioned for engaging and camming the locking bar assembly 15 so as to move the locking bar assembly 15 to either the locked position or the unlocked position. A single key lock assembly 30, such as a standard mechanical key lock, is attached to the disk drive housing 10 and is accessible from the exterior of the disk drive housing 10, and is used for actuating the cam mechanism 35. The key lock assembly 30 is worked in a standard manner such as inserting a key and rotating the lock to actuate the cam mechanism 35. The locking pins 45 are, for example, disposed in front of the disk drive carriers 25 when the locking bar assembly 15 is in the locked position (not illustrated) or, preferably, each disk drive carrier 25 includes a slot 60 (further illustrated in FIGS. 5A-5B) wherein, when said locking bar assembly 15 is in the locked position, the locking pins 45 engage the slots 60 of the corresponding disk drive carriers 25 securing the disk drive carriers 25 into the disk drive carrier bays 20.

Also illustrated are two guides 50, one guide 50 located at each end of the locking bar 40 and each guide 50 having a channel therein. Each end of the locking bar 40 is slideably disposed within the corresponding channel and the guides 50 maintain the locking bar assembly 15 in positional alignment during movement to either the locked or the unlocked position. Two or more resilient members 55, such as springs, are disposed on two or more of the locking pins 45 and are used for facilitating movement of the locking bar assembly 15 and preventing the locking bar assembly 15 from binding during movement to either the locked or the unlocked position.

A perspective view of the locking bar assembly 15, the cam mechanism 35, the key lock assembly 30 and the guides 50 are illustrated in FIG. 2. As illustrated in both FIG. 1 and FIG. 2, in this first embodiment of the present invention, the locking bar 40 is a substantially flat, rectangular-shaped bar and the locking pins 45 are planar with the locking bar 40. The locking bar assembly 15 is, for example, plastic molded together which provides for a very cost effective locking device. The locking bar assembly 15 may, however, also be manufactured of a metal such as steel.

Figures 3, 4:
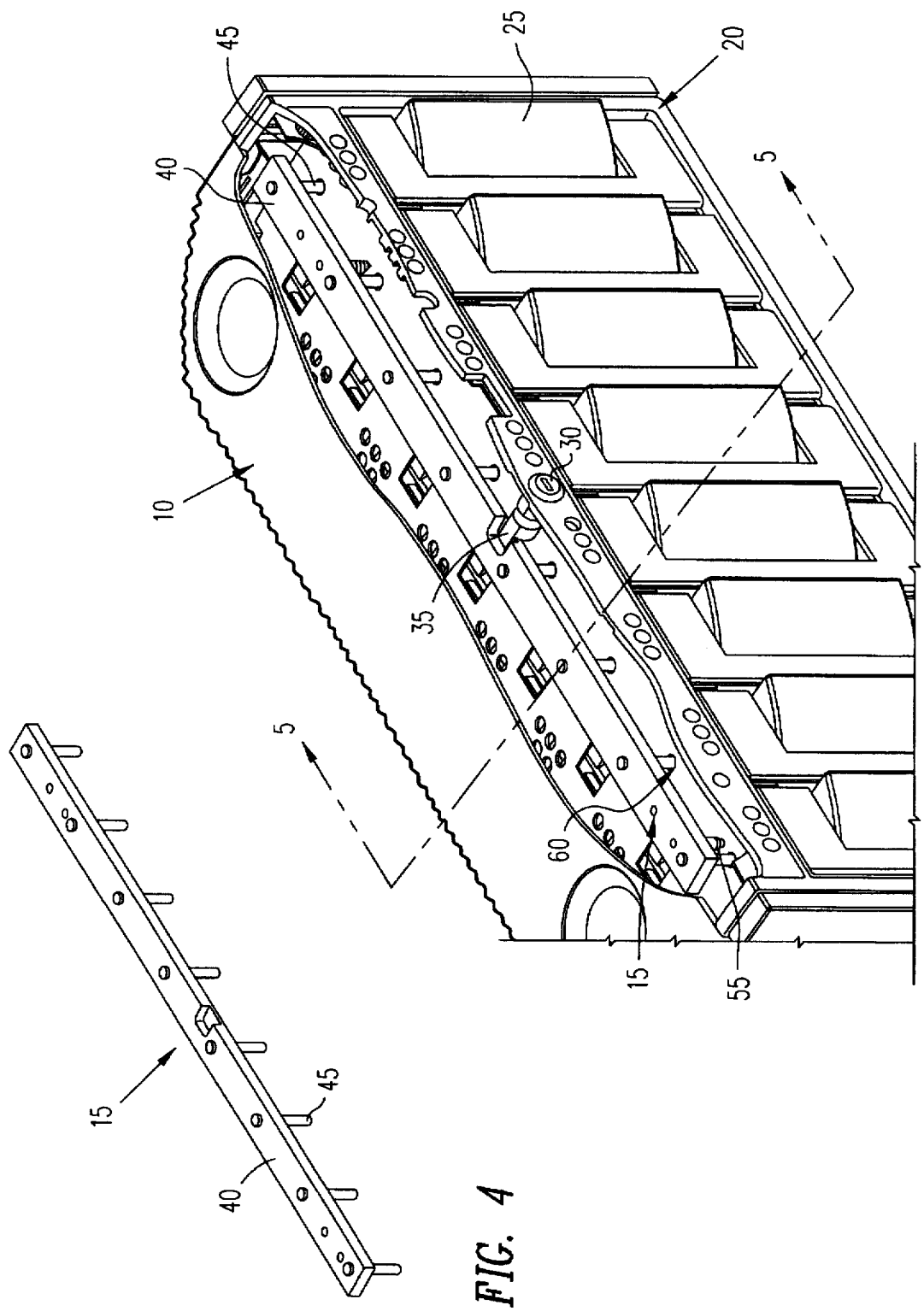
FIG. 3 is a partial perspective view, cut away for clarity, of a disk drive storage cabinet including a locking device in accordance with a second embodiment of the present invention.
FIG. 4 is a perspective view of the locking bar assembly of the FIG. 3.

FIG. 3 and FIG. 4 illustrate a second embodiment of the locking device of the present invention wherein the locking bar 40 is a substantially flat, rectangular-shaped bar and the locking pins 45 project perpendicular of the locking bar 40. FIG. 3 shows a partial perspective view, cutaway for clarity, of the disk drive housing 10 including the locking bar assembly 15 and the frame 27 with at least two disk drive carrier bays 20 in a disk drive carrier opening for housing the associated disk drive carriers 25. The locking device includes the locking bar assembly 15 with the key lock assembly 30 and the cam mechanism 35 for positioning the locking bar assembly 15 in either the locked or the unlocked position. FIG. 4 shows a perspective view of the locking bar assembly 15 including the locking bar 40 and the locking pins 45.

Referring again to FIG. 3, the moveable locking bar assembly 15 is located inside the disk drive housing 10 and spans the disk drive carrier bays 20 and includes the locking bar 40 and at least two locking pins 45 projecting from the locking bar 40, one locking pin 45 for each of the disk drive carriers 25. The locking bar 40 is moveable to either the locked or the unlocked position (illustrated and further described in FIGS. 5A-5B). The cam mechanism 35 is positioned for engaging and camming the locking bar assembly 15 so as to move the locking bar assembly 15 to either the locked position or the unlocked position. The cam mechanism 35 is, for instance, an integral part of the key lock assembly 30 and is coupled to the locking bar 40 for engaging and movement. The single key lock assembly 30 is used for actuating the cam mechanism 35. The locking pins 45 are, for example, disposed in front of the disk drive carriers 25 when the locking bar assembly 15 is in the locked position (not illustrated) or, preferably, each disk drive carrier 25 includes a slot 60 (further illustrated in FIGS. 5A-5B) wherein, when said locking bar assembly 15 is in the locked position, the locking pins 45 engage the slots 60 of the corresponding disk drive carriers 25 securing the disk drive carriers 25 into the disk drive carrier bays 20.

The locking device of the second embodiment is illustrated without the guides, however, the guides may be used in this embodiment also for maintaining the locking bar assembly 15 in positional alignment during movement to either the locked or the unlocked position. Two or more resilient members 55, such as springs, are used for facilitating movement of the locking bar assembly 15 and preventing the locking bar assembly 15 from binding during movement to either the locked or the unlocked position.

Figure 5A:
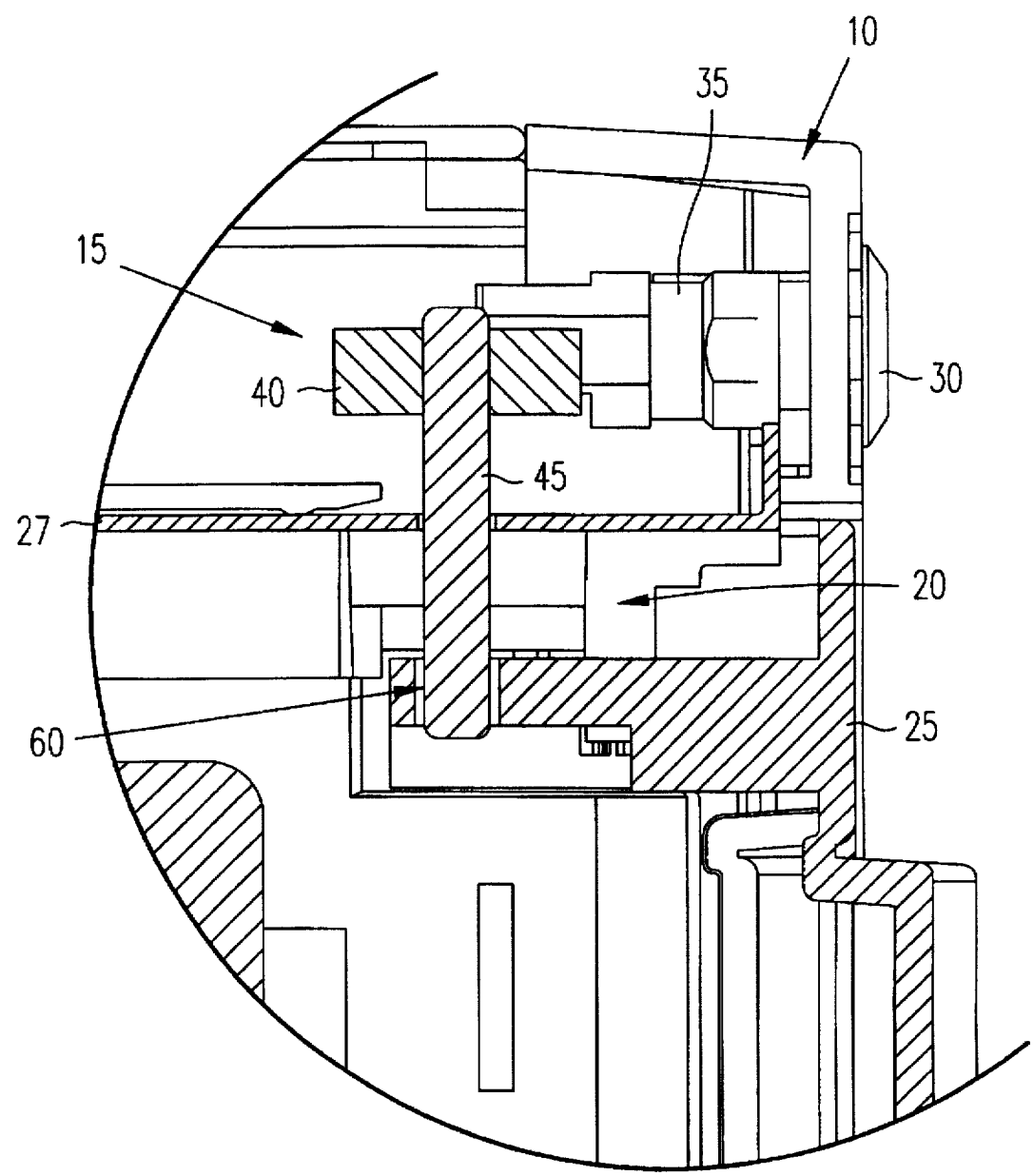
FIG. 5A AND 5B are partial cross section views taken along line 5—5 of FIG. 3 illustrating the locking bar assembly in the locked position (FIG. 5A) and the unlocked position (FIG. 5B)
Figure 5B:
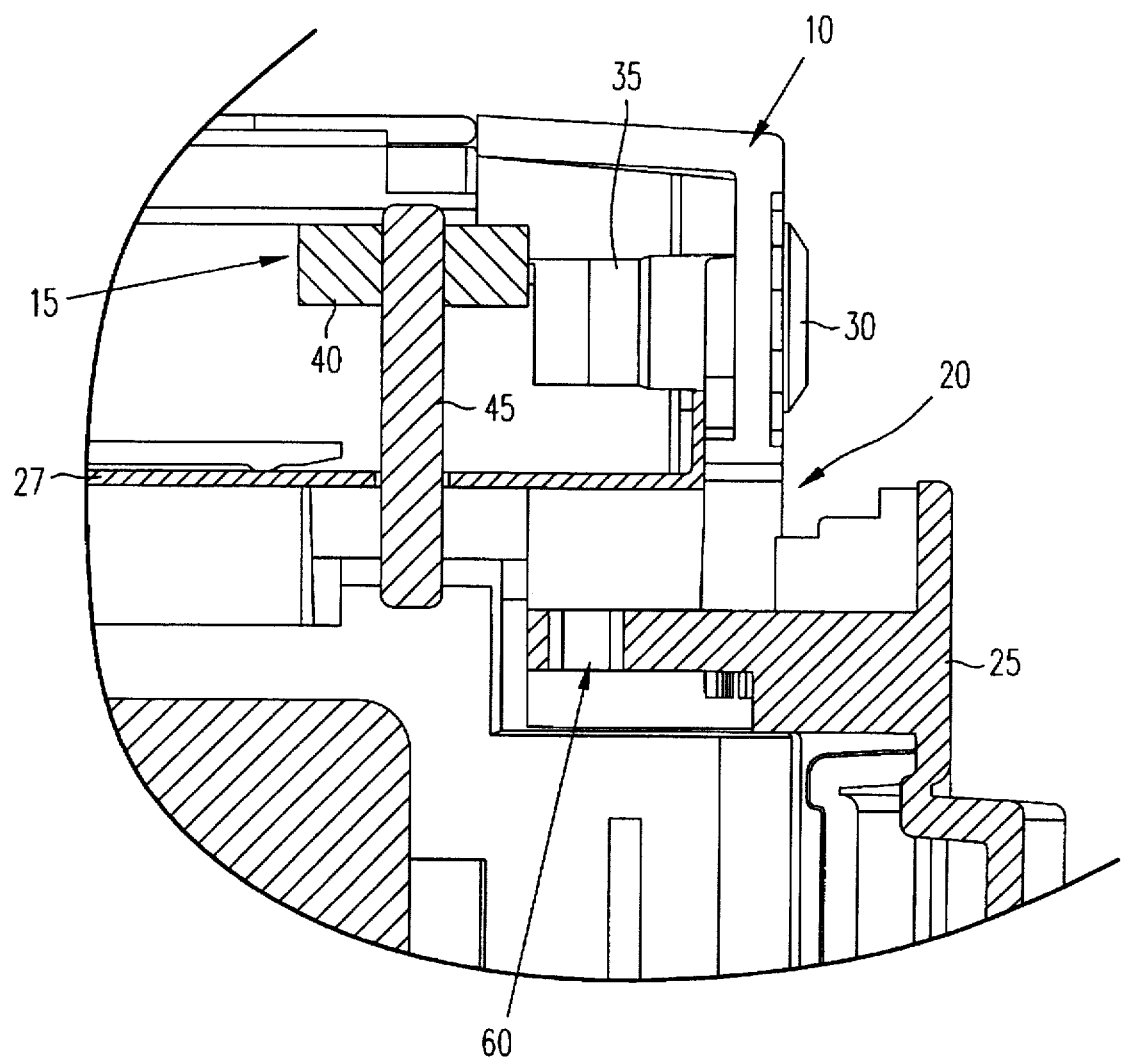

FIGS. 5A and 5B are partial cross section views taken along line 5—5 of FIG. 3 illustrating the second embodiment of the locking device of the present invention in the locked position (FIG. 5A) and the unlocked position (FIG. 5B). FIG. 5A illustrates the locking bar assembly 15 located inside the disk drive housing 10 and in the locked position wherein the locking pin 45 engages the slot 60 in the corresponding disk drive carrier 25 securing the disk drive carrier 25 into the disk drive carrier bay 20. The single key lock assembly 30, accessible from the exterior of the disk drive housing 10, actuates the cam mechanism 35 to position the locking bar assembly 15 in the locked or the unlocked position. The key lock assembly 30 is, for example, attached to the disk drive housing 10 or cabinet and to the frame 27 for the disk drive carrier openings 20. While the figures illustrate a separate frame for the disk drive carrier openings, the disk drive housing or cabinet itself may be used as the frame for the disk drive carrier opening and disk drive carrier bays.

In FIG. 5B, the locking bar assembly 15 is illustrated in the unlocked position wherein the locking bar 40 has been moved such that the locking pin 45 no longer engages the slot 60 of the disk drive carrier 25 and the disk drive carrier 25 is no longer secured within the disk drive carrier bay 20 and is removable from the disk drive housing 10. FIG. 5B shows the disk drive carrier 25 as partially removed from the disk drive carrier bay 20 to more clearly illustrate the unlocked position. The locking bar assembly 15 is, for example, moved towards the disk drive carrier 25 into the locked position to engage the locking pin 45 into the slot 60 in the disk drive carrier 25 and then moved away from the disk drive carrier 25 to the unlocked position to disengage the locking pin 45.

Figure 6:
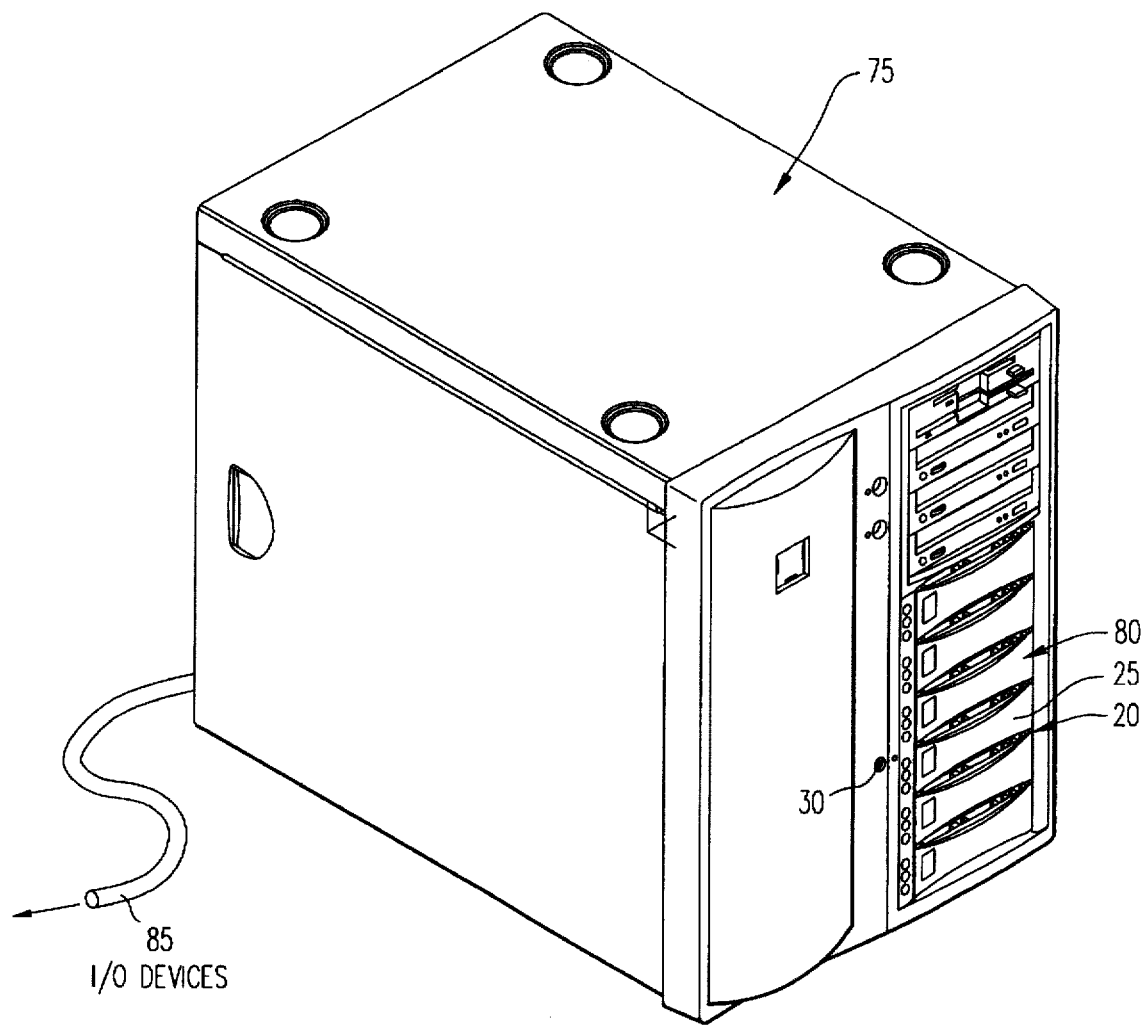
FIG. 6 is a perspective view of a computer system incorporating the locking device of the present invention and illustrating the single key lock feature.

FIG. 6 is a perspective view illustrating a computer system 70 including a central computer or server 75 with a hard drive array unit 80 incorporating the locking device of the present invention and including input and output devices 85 (not illustrated). The server 75 with the hard drive array unit 80 illustrates the disk drive carriers 25 and the disk drive carrier bays 20 and illustrates the single key lock assembly 30 feature of the locking bar assembly which is located inside the disk drive housing, which, in this illustration, is the server cabinet.

While there has been illustrated and described particular embodiments of the present invention, it will be appreciated that numerous changes and modifications will occur to those skilled in the art, and it is intended in the appended claims to cover all those changes and modifications which fall within the true spirit and scope of the present invention.

The present invention provides a simple, compact and cost effective locking device that simultaneously secures a multiple of hard disk drive carriers or cartridges in a disk drive housing within a confined space and which is operated with a single key lock which allows for reliability and ease of use not previously available. While the disk drive housing described in the figures illustrates a hard drive array unit storage cabinet as part of a computer system, the locking device of the present invention may be used in any central computer system, server or computer subsystem wherein multiple disk drives are to be secured within a cabinet, frame or housing. Other embodiments are within the following claims, and, while only certain preferred features of the invention have been shown by way of illustration, many modifications and changes will occur. It is therefore to be understood that the present claims are intended to cover all such modifications and changes which fall within the true spirit of the invention.

What is claimed is:

1. In a disk drive housing having at least two disk drive carrier bays in a disk drive carrier opening housing one or more corresponding disk drive carriers, a locking device for securing said disk drive carriers into said disk drive carrier bays, comprising:

a moveable locking bar assembly located inside said disk drive housing and spanning the disk drive carrier bays and comprising a locking bar and at least two locking pins projecting from said locking bar, one locking pin for each of said disk drive carriers bays, wherein said locking bar is moveable to either a locked or an unlocked position;

a key lock assembly attached to said disk drive housing and accessible from the exterior of said disk drive housing; and a cam mechanism positioned for engaging and camming the locking bar assembly so as to move said locking bar assembly to either the locked position or the unlocked position, said cam mechanism actuated by said key lock assembly wherein, when said locking bar assembly is in the locked position, said locking pins engage the corresponding disk drive carriers securing the disk drive carriers into the disk drive carrier bays.

2. The locking device of claim 1 further comprising:

a slot in each disk drive carrier wherein, when said locking bar assembly is in a locked position, said locking pins engage said slots of the corresponding disk drive carriers securing the disk drive carriers into the disk drive carrier bays.

3. The locking device of claim 1 wherein, when said locking bar assembly is in a locked position, said locking pins are disposed in front of the corresponding disk drive carriers wherein said disk drive carriers are engaged and secured into the disk drive carrier bays.

4. The locking device of claim 1 wherein said locking bar is a substantially flat, rectangular-shaped bar and wherein said locking pins are planar with said locking bar.

5. The locking device of claim 1 wherein said locking bar is a substantially flat, rectangular-shaped bar and wherein said locking pins project perpendicular of said locking bar.

6. The locking device of claim 1 further comprising:

two guides, one guide located at each end of said locking bar and each guide having a channel therein wherein each end of said locking bar is slideably disposed within the corresponding channel and said guides maintain said locking bar assembly in positional alignment during movement to either the locked or the unlocked position.

7. The locking device of claim 1 further comprising:

two or more resilient members disposed on two or more locking pins for facilitating movement and preventing the locking bar assembly from binding while said locking bar assembly is moved to either the locked or the unlocked position.

8. The locking device of claim 7 wherein said resilient members are springs.

9. The locking device of claim 1 wherein said locking bar and said locking pins are plastic molded together.

10. The locking device of claim 1 wherein said locking bar and said locking pins are manufactured of a metal material.

11. The locking device of claim 1 wherein said cam mechanism is an integral part of the key lock assembly.

12. In a disk drive housing having at least two disk drive carrier bays in a disk drive carrier opening housing one or more corresponding disk drive carriers, a locking device for securing said disk drive carriers into said disk drive carrier bays, comprising:

a moveable locking bar assembly located inside said disk drive housing and spanning the disk drive carrier bays, and comprising a substantially flat, rectangular-shaped locking bar and at least two locking pins projecting from and planar with said locking bar, one locking pin for each of said disk drive carrier bays, wherein said locking bar is moveable to either a locked or an unlocked position;

two guides, one guide located at each end of said locking bar and each guide having a channel therein wherein each end of said locking bar is slideably disposed within the corresponding channel and said guides maintain said locking bar assembly in positional alignment during movement to either the locked or the unlocked position;

a cam mechanism positioned for engaging and camming the locking bar assembly so as to move said locking bar assembly to either the locked position or the unlocked position;

a key lock assembly attached to said disk drive housing and accessible from the exterior of said disk drive housing for actuating said cam mechanism; and a slot in each disk drive carrier wherein, when said locking bar assembly is in the locked position, said locking pins engage the slots of the corresponding disk drive carriers securing the disk drive carriers into the disk drive carrier bays.

13. The locking device of claim 12 further comprising:

two or more springs disposed on two or more locking pins for facilitating movement and preventing the locking bar assembly from binding while said locking bar assembly is moved to either the locked or the unlocked position.

14. In a disk drive housing having at least two disk drive carrier bays in a disk drive carrier opening housing one or more corresponding disk drive carriers, a locking device for securing said disk drive carriers into said disk drive carrier bays, comprising:

a moveable locking bar assembly located inside said disk drive housing and spanning the disk drive carrier bays and comprising a substantially flat, rectangular-shaped locking bar and at least two locking pins projecting from and perpendicular of said locking bar, one locking pin for each of said disk drive carrier bays, wherein said locking bar is moveable to either a locked or an unlocked position;

a cam mechanism positioned for engaging and camming the locking bar assembly so as to move said locking bar assembly to either the locked position or the unlocked position;

a key lock assembly attached to said disk drive housing and accessible from the exterior of said disk drive housing for actuating said cam mechanism; and a slot in each disk drive carrier wherein, when said locking bar assembly is in the locked position, said locking pins engage the slots of the corresponding disk drive carriers securing the disk drive carriers into the disk drive carrier openings.

15. The locking device of claim 14 further comprising:

two or more springs disposed on two or more locking pins for facilitating movement and preventing the locking bar assembly from binding while said locking bar assembly is moved to either the locked or the unlocked position.

16. A computer system including a central processing unit, associated memory and associated input and output devices and including a housing unit having at least two disk drive carrier bays in a disk drive carrier opening housing one or more corresponding disk drive carriers and a locking device for securing said disk drive carriers into said disk drive carrier bays, said locking device comprising:

a moveable locking bar assembly located inside said disk drive housing and spanning the disk drive carrier bays and comprising a locking bar and at least two locking pins projecting from said locking bar, one locking pin for each of said disk drive carrier bays, wherein said locking bar is moveable to either a locked or an unlocked position;

a key lock assembly attached to said disk drive housing and accessible from the exterior of said disk drive housing; and a cam mechanism positioned for engaging and camming the locking bar assembly so as to move said locking bar assembly to either the locked position or the unlocked position, said cam mechanism actuated by said key lock assembly wherein, when said locking bar assembly is in the locked position, said locking pins engage the corresponding disk drive carriers securing the disk drive carriers into the disk drive carrier bays.

17. The computer system of claim 16 further comprising:

a slot in each disk drive carrier wherein, when said locking bar assembly is in a locked position, said locking pins engage said slots of the corresponding disk drive carriers securing the disk drive carriers into the disk drive carrier bays.

18. The computer system of claim 16 wherein, when said locking bar assembly is in a locked position, said locking pins are disposed in front of the corresponding disk drive carriers wherein said disk drive carriers are engaged and secured into the disk drive carrier bays.

19. The computer system of claim 16 wherein said locking bar is a substantially flat, rectangular-shaped bar and wherein said locking pins are planar with said locking bar.

20. The computer system of claim 16 wherein said locking bar is a substantially flat, rectangular-shaped bar and wherein said locking pins project perpendicular of said locking bar.

21. The computer system of claim 16 further comprising:

two guides, one guide located at each end of said locking bar and each guide having a channel therein wherein each end of said locking bar is slideably disposed within the corresponding channel and said guides maintain said locking bar assembly in positional alignment during movement to either the locked or the unlocked position.

22. The computer system of claim 16 further comprising:

two or more springs disposed on two or more locking pins for facilitating movement and preventing the locking bar assembly from binding while said locking bar assembly is moved to either the locked or the unlocked position.

* * * * *